United States Patent
Howard et al.

(10) Patent No.: US 6,873,040 B2
(45) Date of Patent: Mar. 29, 2005

(54) SEMICONDUCTOR PACKAGES FOR ENHANCED NUMBER OF TERMINALS, SPEED AND POWER PERFORMANCE

(75) Inventors: Gregory E. Howard, Dallas, TX (US); Mukul Saran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/614,851

(22) Filed: Jul. 8, 2003

(65) Prior Publication Data

US 2005/0006739 A1 Jan. 13, 2005

(51) Int. Cl.[7] .................................................. H01L 23/48
(52) U.S. Cl. ...................... 257/691; 257/693; 257/775; 257/787
(58) Field of Search ................................ 257/691, 693, 257/787, 775

(56) References Cited

U.S. PATENT DOCUMENTS

| | | | | |
|---|---|---|---|---|
| 5,523,586 A | * | 6/1996 | Sakurai | 257/48 |
| 5,578,869 A | * | 11/1996 | Hoffman et al. | 257/691 |
| 5,608,262 A | * | 3/1997 | Degani et al. | 257/723 |
| 5,724,230 A | * | 3/1998 | Poetzinger | 361/758 |
| 5,790,384 A | * | 8/1998 | Ahmad et al. | 361/760 |
| 5,798,567 A | * | 8/1998 | Kelly et al. | 257/723 |
| 5,889,323 A | * | 3/1999 | Tachibana | 257/704 |
| 5,901,050 A | * | 5/1999 | Imai | 361/820 |
| 6,084,308 A | * | 7/2000 | Kelkar et al. | 257/777 |
| 6,188,578 B1 | * | 2/2001 | Lin et al. | 361/717 |

* cited by examiner

*Primary Examiner*—Jasmine Clark
(74) *Attorney, Agent, or Firm*—Yingsheng Tung; Wade James Brady, III; Frederick J. Telecky, Jr.

(57) ABSTRACT

An integrated circuit device package with a first part (101) having a cavity (104) to mount the chip (105), further I/O terminals (102) on the top surface and terminals (103) on the bottom surface. The chip has contact pads (107a and 107b). The second part (110) of the package has bottom surface terminals (111) aligned with the chip contact pads, and bottom terminals (112) aligned with the terminals (102) of the first package part. The connections are provided by stud bumps between the chip contact pads and terminals (111), and by reflow material between terminals (102) and (1.12). The connector lines (109a and 109b) in the second package part (110) comprise signal/power and ground layers. The layers are spaced by insulation between. 10 and 50 $\mu$m thick, and the connector lines have a width less than three times the insulator thickness.

28 Claims, 3 Drawing Sheets

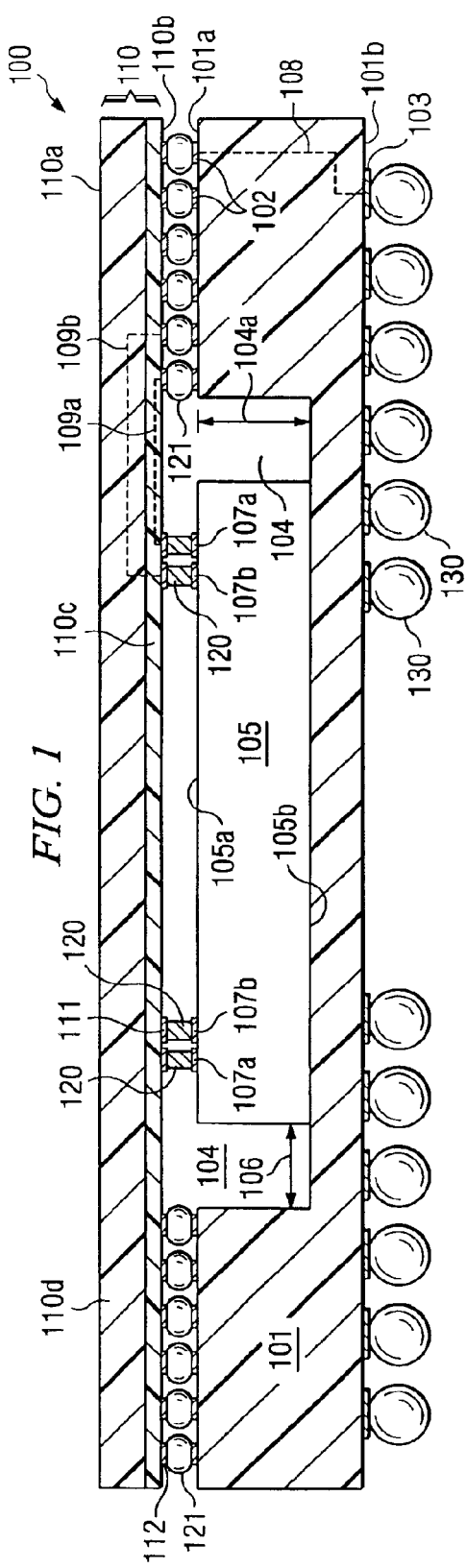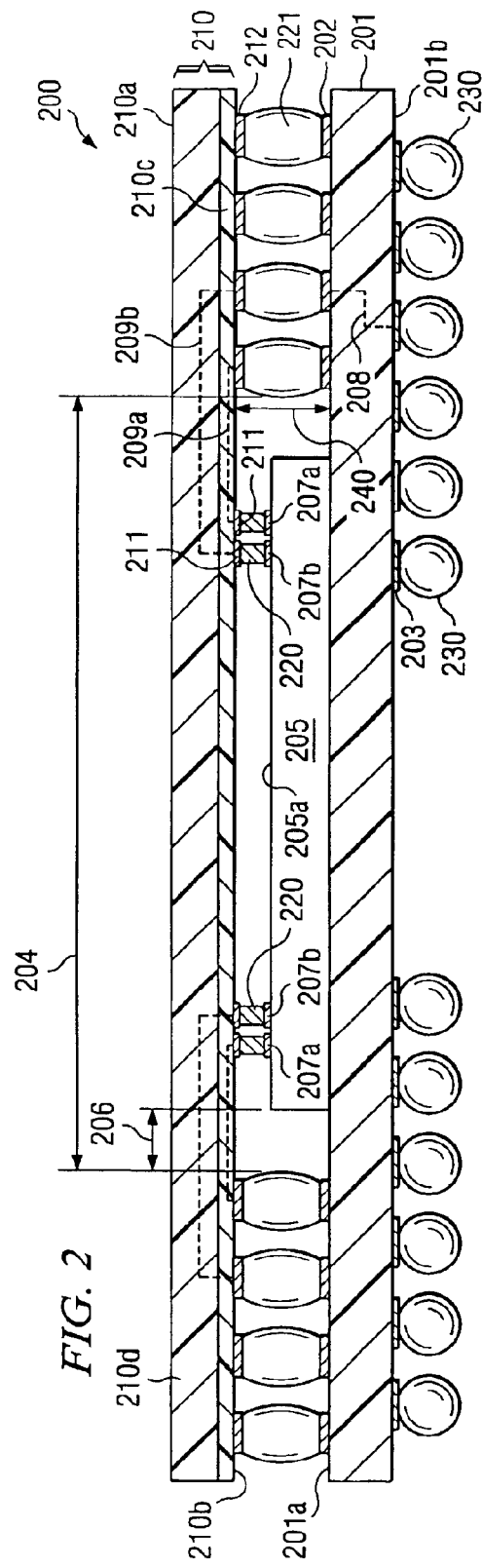

SEMICONDUCTOR PACKAGES FOR ENHANCED NUMBER OF TERMINALS, SPEED AND POWER PERFORMANCE

FIELD OF THE INVENTION

The present invention is related in general to the field of semiconductor devices and more specifically to structures and fabrication methods of ball grid array packages providing for increased input/output terminals, speed and power.

DESCRIPTION OF THE RELATED ART

Two of the ongoing trends in integrated circuit (IC) technology are the drives towards higher integration and shrinking component feature sizes. Higher levels of integration include the need for higher numbers of signal lines and power lines, yet smaller feature sizes make it more and more difficult to preserve clean signals without mutual interference. In addition, with increasing signal frequencies, transmission and shielding of signals require careful attention.

These trends and requirements do not only dominate the semiconductor chips, which incorporate the ICs, but also the packages, which house and protect the IC chips. Actually, boards and other parts of an electronic product have to be included in these considerations as a system.

The growing popularity of flip-chip assembly in the fabrication process flow of silicon integrated circuit (IC) devices is driven by several facts. First, the electrical performance of the semiconductor devices can commonly be improved when the parasitic inductances correlated with conventional wire bonding interconnection techniques are reduced. Second, flip-chip assembly often provides higher interconnection densities between chip and package than wire bonding. Third, in many designs flip-chip assembly consumes less silicon "real estate" than wire bonding, and thus helps to conserve silicon area and reduce device cost. And fourth, the fabrication cost can often be reduced, when concurrent gang-bonding techniques are employed rather than consecutive individual bonding steps.

The conventional fabrication process uses solder balls, or bumps, and their reflow technique as the standard method of ball bonding. In known technology, however, the achievable bump pitch is limited. For solder materials, bumps or balls are presently limited to 160 $\mu$m pitch. These limits severely restrict the number of connections that can be made on the available chip surface, and constrain the use of flip-chip techniques for devices having small integrated circuit (IC) chips.

Efforts were undertaken later to replace solder-based interconnecting balls with gold bumps. Major progress was achieved in attaching metal leads (for example, copper or tin-plated copper) to gold bumps by the so-called "tape-automated bonding" (TAB) technique. This technique, however, gained only limited acceptance due to its high relative cost compared to conventional wire ball bonding or solder reflow bonding. The manufacturing cost was not substantially lowered by an effort to create gold bumps by a modified wire ball technique. In this technique, the bumps are allowed to retain a small "tail" which is formed when the gold wire is broken off after the free air ball has been formed and pressured as a "bump" against the substrate. For gold stud bumps or gold-plated bumps, 25 $\mu$m diameter is the lower value for devices in production presently. Since the "bumps" are created one by one, this approach is not cost effective for mass production. It also does not lend itself easily for a small, chip-scale device.

A need has therefore arisen for a coherent, low-cost method of assembling high lead count devices which has excellent electrical performance, especially speed and power, mechanical stability, and high product reliability. The fabrication method should be flexible enough to be applied for different semiconductor product families and a wide spectrum of design and process variations. Preferably, these innovations should be accomplished while shortening production cycle time and increasing throughput, and using the installed equipment base so that no investment in new manufacturing machines is needed.

SUMMARY OF THE INVENTION

One embodiment of the invention is an integrated circuit (IC) device assembled in a cavity-type package. The first part of the package has a cavity to mount the chip and input/output (I/O) terminals on the top and bottom surface, connected by conductive lines. An IC chip with contact pads is mounted in the cavity. The second part of the package, serving as the package lid, has on its bottom surface a first plurality of I/O terminals aligned with the chip contact pads, and a second plurality of I/O terminals aligned with the I/O terminals on the top surface of the first package part. These pluralities of terminals are connected by conductive lines. Interconnection elements between the chip contact pads and the first plurality of I/O terminals of the second package part are preferably gold or gold alloy stud "bumps". Interconnection elements between the second plurality of I/O terminals of the second package part and the top surface terminals of the first package part are preferably reflow "bumps", including solder balls. The connector lines in the second package part comprise a signal layer, a power layer, and a ground layer. The layers are spaced by insulation between 10 and 50 $\mu$m thick, and the connector lines have a width less than three times the insulator thickness.

Another embodiment of the invention, also involving a device in a cavity-type package, aims at chips, which have central contact pads and peripheral contact pads. The lid of the cavity has a central opening sized to expose the central contact pads of the chip when mounted in the cavity. Furthermore, the lid has a top surface with I/O terminals distributed around the opening, and connector lines between these terminals and the lid's I/O terminals facing the I/O terminals of the cavity part of the package. The interconnection elements between these sets of I/O terminals are preferably reflow. "bumps". Bonding wires connect the central chip contact pads and the I/O terminals on the top lid surface. The density of wire bonded chip I/O contact pads greatly increases the total number of chip I/Os. In addition, the lid has a plurality of I/O terminals aligned with the peripheral chip contact pads. The interconnection elements between these peripheral chip contact pads and the lid's I/O terminals are preferably gold stud "bumps". The conductive lines of the lid, connecting the various I/O terminals, comprise a signal layer, a power layer, and a ground layer. The layers are spaced by insulation between 10 and 50 $\mu$m thick, and the connector lines have a width less than three times the insulator thickness. Encapsulation material covers the bonding wires and at least portions of the lid and the chip.

Both embodiments described above may have interconnection elements, such as reflow bumps, attached to the outside surface of the cavity-shaped part of the package; these elements serve to connect to external parts such as a substrate or a printed circuit board.

Embodiments of the present invention are related to high pin count devices intended for high speed and power performance. It is a technical advantage that the invention offers the device designer several independent parameters to achieve high speed, control signal integrity and inductance, and increase power performance. The parameters include the number and separation of the signal, power and ground planes, the widths of the connector lines, the location of the package I/O terminals relative to the chip contact pads, and the choice and electrical characteristics of the interconnection elements. One or more embodiments of the invention offer choices including small gold bumps, more massive reflow bumps, and controlled wire bonding. Furthermore, several of these choices make the device less sensitive to environmental influences or temperature variations.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic cross section of the package of an electronic device according to an embodiment of the invention.

FIG. 2 is a schematic cross section of the package of an electronic device according to another embodiment of the invention.

DETAILED DESCRIPTION OF THE PREFERRED EMBODIMENTS

Figure 3:
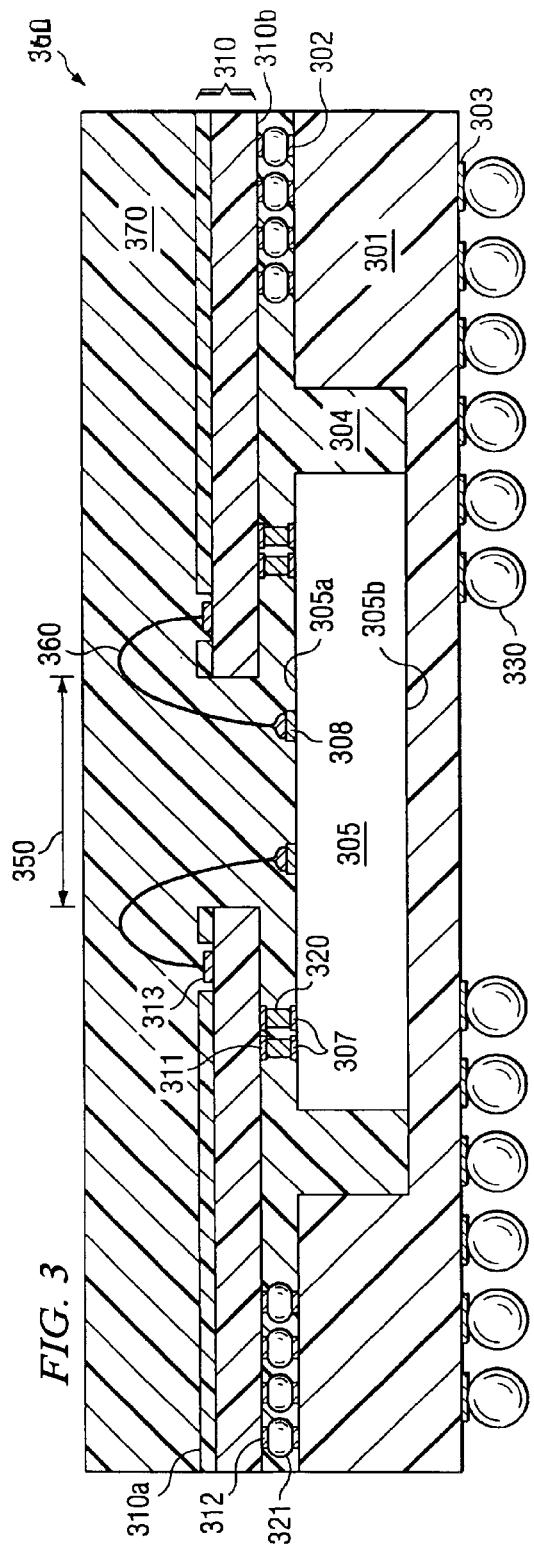
FIG. 3 is a schematic cross section of the package of an electronic device according to another embodiment of the invention.

The schematic cross section of FIG. 1 illustrates a packaged integrated circuit (IC) device for enhanced speed and power performance, generally designated 100, representing an embodiment of the invention. The package comprises a first package part 101 made of plastic, including FR-4, or ceramic, which has a top surface 101a and a bottom surface 101b. On top surface 101a is a plurality of I/O terminal pads 102, and on bottom surface 101b is another plurality of I/O terminals pads 103.

Integral with package part 101 are connector lines between terminal pads 102 and terminal pads 103; an example of these connector lines is schematically shown in FIG. 1 as dashed trace 108.

The first package part 101 is formed so that it offers a cavity 104, which is shaped to have an integrated circuit chip 105 mounted in cavity 104. It is a technical advantage of this embodiment of the invention that cavity 104 is sized so that it can accept a variety of chip sizes 105. Chips 105 may have various lengths, widths, and circumference contours. In the example of FIG. 1, chip 105 is mounted approximately in the center of cavity 104, but does not use up the complete opening and thus leaves a distance 106 unoccupied. For devices in which the thickness of the semiconductor chip after back-grinding is standardized, the depth 104a of cavity 104 can be standardized.

FIG. 1 shows a chip 105 mounted in the cavity 104 of first package part 101 (typically using an epoxy adhesive, not shown in FIG. 1). Chip 105 has an active surface 105a including the integrated circuit and contact pads, commonly distributed in the region of the chip periphery. In the example of FIG. 1, chip 105 has two rows 107a and 107b of peripheral contact pads for reasons explained below.

The embodiment of FIG. 1 further comprises a second package part 110 made of plastic, including FR-4, or ceramic, which has a top surface 11a and a bottom surface 10b. This second package part is sometimes referred to as the "lid" of the package in FIG. 1. The bottom surface 10b has a first plurality 111 of I/O terminals, which are aligned with the chip contact pads 107a and 107b. The bottom surface 10b further has a second plurality 112 of I/O terminals, which are aligned with the top surface I/O terminals 102 of the first package part 101.

The second package part 110 also has connector lines, or "routing traces", between the first terminal plurality 111 and the second terminal plurality 112. Examples are schematically shown in FIG. 1 as dashed traces 109a and 109b. For the lowest cost of the second package part 110, these connector lines comprise only two routing layers: one signal (and power) routing layer, and one ground routing layer. The thickness of the ground plane is preferably between 5 and 75 $\mu$m, providing mechanical rigidity to the package lid 110. In FIG. 1, the signal (and power) routing of part 110 is schematically indicated by layer 110c, and the ground routing by layer 110d. These two routing layers 110c and 110d determine the need for the two rows 107a and 107b of contact pads on chip 105. If, in other embodiments of the invention, one sacrifices the low cost of the lid 110 and adds more routing layers to the lid, then one can add more contact pad rows on the chip surface. As an example, a power layer may be added to the signal and ground layers.

In the embodiment illustrated in FIG. 1, the signal (and power) layer 110c is spaced from the ground layer 110d by insulation of a thickness between 10 and 50 $\mu$m. The signal layer is formed into lines having a width less than three times the insulator thickness. The narrow width of the conducting lines, together with their spacing and layout, and the insulator thickness to ground, provide controlled impedance and smaller signal cross talk.

The embodiment of FIG. 1 depicts two types of interconnection elements between the chip and package. In order to keep the size of the chip contact pads as small as possible, the interconnection elements between the chip contact pads 107a and 107b and the first plurality 111 of terminals of lid 110 are illustrated as stud bumps 120. Preferably, the chip contact pads 107a and 107b, and thus the stud bumps 120, are spaced apart by less than 100 $\mu$m center to center. As an example, for a chip having 10 mm side length and a stud bump pitch of 40 $\mu$m, 250 trace connections can be accommodated per chip side. The stud bumps are preferably made of gold, copper, copper/nickel/palladium, or alloys thereof. It is advantageous to plate or otherwise deposit these stud bumps on the chip contact pads 107a and 107b before singulation, while the semiconductor wafer is still in wafer form.

The other type of interconnection elements are between the second plurality 112 of terminals of the lid 110 and the top surface terminals 102 of the first package part 101. These interconnection elements 121 are preferably reflow interconnections such as solder "balls". Reflow balls or bumps typically use materials such as tin, tin alloys including tin/copper, tin/indium, tin/silver, tin/bismuth, tin/lead, indium, or conductive adhesives, or even z-axis conductives. It is practical to apply reflow interconnections onto the surface terminals 102 of the first package part 101 before the lid 110 is aligned with the first package part 101 for closing the package.

The bottom surface terminals 103 of the first package part 101 serve to connect to external parts. This connection may be accomplished by pressure contacts. Alternatively, as FIG. 1 shows, interconnection elements 130 may be attached to the bottom surface terminals 103 of the first package part 101. Preferably, these interconnection elements 130 are made of a reflow material and the connection to external parts is accomplished by soldering.

It is a technical advantage of the embodiment shown in FIG. 1 that the package can be used for different chip sizes by only redesigning the first plurality 111 of I/O terminals of the lid 110 for the different chip sizes and contact pads. Utilizing flip chip assembly offers greatly reduced IR drop to the silicon core circuits compared to wire bonding; significant reduction of power and ground inductances; moderate improvement of signal inductance; moderate difference in peak noise; and moderate reduction in pulse width degradation.

For enhancing the mechanical package stability and protecting the IC and connections against moisture and other environmental influences, the remaining openings of cavity 104 and all spaces between the interconnection elements may be filled with an underfill material based on epoxy or another polymer.

Another embodiment of the invention, generally designated 200, is displayed in the schematic cross section of FIG. 2. This embodiment is especially suitable for very thin semiconductor chips, which can be produced by backgrinding semiconductor wafers to a thickness of approximately 100 $\mu$m or less. The package comprises a first part 201, which has a top surface 201a and a bottom surface 201b. On top surface 201a is a plurality of I/O terminal pads 202, and on bottom surface 201b is another plurality of I/O terminal pads 203. Integral with package part 201 are connector lines between terminal pads 202 and terminal pads. 201; an example of these connector lines is schematically shown in FIG. 2 as trace 208.

The first package part 201 is formed like a sheet. On surface 201a is space for mounting a semiconductor chip 205. It is a technical advantage of this embodiment of the invention that the mounting space has lateral dimensions 204 so that it can accept a variety of chip sizes in terms of lengths, widths, and circumference contours. In the example of FIG. 2, a chip 205 is mounted on surface 201a so that it is positioned approximately in the center of first package part 201, leaving some unused space 206 to the terminal pads 202.

Chip 205 in FIG. 2 has an active surface 205a including the integrated circuit and contact pads, commonly distributed in the region of the chip periphery. In the example of FIG. 2, chip 205 has two rows 207a and 207b of peripheral contact pads, because the second package part 210 (the package "lid") has only two routing layers.

The lid 210 has a top surface 210a and a bottom surface 210b. The bottom surface 210b has a first plurality 211 of I/O terminals, which are aligned with the chip contact pads 207a and 207b. The bottom surface 210b further has a second plurality 212 of I/O terminals, which are aligned with the top surface I/O terminals 202 of the first package part 201.

Lid 210 also has connector lines, or "routing traces", between the first terminal plurality 211 and the second terminal plurality 212. Examples are schematically shown in FIG. 2 as dashed traces 209a and 209b. For the lowest cost of the second package part 210, these connector lines comprise only two routing layers: one signal (and power) routing layer, and one ground routing layer. The thickness of the signal (and power) and ground planes is preferably between 25 and 75 $\mu$m, providing mechanical rigidity to the package lid 210. In FIG. 2, the signal (and power) routing of lid 210 is schematically indicated by layer 210c, and the ground routing by layer 210d. Ground layer 210d may be a solid metal layer; it is spaced from the signal layer by insulation between 10 and 50 $\mu$m thickness. The layers are formed into lines of a width less than three times the insulator thickness. The two routing layers 210c and 210d determine the need for the two rows 207a and 207b of contact pads on chip 205. If, in other embodiments of the invention, one sacrifices the low cost of the lid 210 and adds more routing layers to the lid, such as a power layer, then one can add more contact pad rows on the chip surface.

The embodiment of FIG. 2 depicts two types of interconnection elements between the chip and package. In order to keep the size of the chip contact pads as small as possible, the interconnection elements between the chip contact pads 207a and 207b and the first plurality 211 of terminals of lid 210 are illustrated as stud bumps 220. Preferably, the chip contact pads 207a and 207b, and thus the stud bumps 220, are spaced apart by less than 100 $\mu$m center to center. As an example, for a chip having 10 mm side length and a stud bump pitch of 40 $\mu$m, 250 trace connections can be accommodated per chip side. The stud bumps are preferably made of gold, copper, copper/nickel/palladium, or alloys thereof.

The other type of interconnection elements is between the second plurality 212 of lid terminals and the top surface terminals 202 of the first package part 201. These interconnection elements 221 are preferably reflow interconnections such as solder "balls". Reflow balls or bumps typically use materials such as tin, tin alloys including tin/copper, tin/indium, tin/silver, tin/bismuth, tin/lead, indium, or conductive adhesives, or even z-axis conductives. It is practical to apply reflow interconnections onto the surface terminals 202 of the first package part 201 before the lid 210 is aligned with the first package part 201 for closing the package. As FIG. 2 indicates, the reflow interconnections 221 are sized to bridge the distance 240 between first package part 201 and lid 210.

The bottom surface terminals 203 of the first package part 201 serve to connect to external parts. This connection may be accomplished by pressure contacts. Alternatively, as FIG. 2 shows, interconnection elements 230 may be attached to the bottom surface terminals 203 of the first package part 201. Preferably, these interconnection elements 230 are made of a reflow material and the connection to external parts is accomplished by soldering.

For enhancing the mechanical package stability and protecting the IC and connections against moisture and other environmental influences, the opening 240 and all spaces between the interconnection elements may be filled with an underfill material based on epoxy or another polymer.

There are several methods to fabricate devices as displayed in FIGS. 1 and 2. Referring to FIG. 1, a preferred method of assembling an IC chip (105) having a passive surface (105b) and an active surface (105a) including contact pads (107a, 107b) into a cavity package, comprises the steps of:

depositing an interconnection element (120) on each chip contact pad (for instance by plating, electro-plating, sputtering or evaporating);

providing a first package part (101) having a cavity (104), I/O terminals on its top surface and its bottom surface (102 and 103, respectively);

mounting the passive chip surface (105b) into the cavity;

depositing reflow interconnection material (121) on each of the top surface I/O terminals (102) of the first package part (101) (for instance by plating, electro-plating, or attaching prefabricated units);

providing a second package part (110) having, on its bottom surface (110b), a first plurality (111) of I/O terminals aligned with the chip contact pads (107a, 107b), and a second plurality (112) of I/O terminals aligned with the top surface I/O terminals (102) of the first package part (101);

assembling the first plurality (111) of I/O terminals of the second package part (110) onto the active chip surface (for instance by thermo-compression gang bonding); and reflowing the interconnection material (121) of the top surface I/O terminals (102) of the first package part with the second plurality (112) of I/O terminals of the second package part.

For some devices it may be advantageous to add a process step of underfilling an adhesive non-conductive polymer into any spaces between the chip, the cavity, the second package part, and the interconnection elements, thereby strengthening the assembled device.

Furthermore, for many devices one may add the process step of attaching reflow interconnections to the I/O terminals (103) on the bottom surface of the first package part (101).

Another embodiment of the invention, generally designated 300, is displayed in the schematic cross section of FIG. 3. This embodiment aims at devices in which the high density of routing in the lid precludes a large number of vias in the lid area above the chip. The embodiment solves this dilemma by using wire bonds as a substitute for a high density via layer. For the protection of the sensitive bonding wires, portions of the package are encapsulated.

The first part 301 of the package in FIG. 3 is formed so that it offers a cavity 304, which is shaped to have an IC chip 305 mounted in the cavity. In close similarity to the embodiment in FIG. 1, cavity 304 is sized so that it can accept a variety of chip sizes. First part 301 also has I/O terminal pads 302 on the top surface, and I/O terminal pads 303 on the bottom surface. The connector lines between terminal pads 302 and 303 are integral with package part 301, but not shown in FIG. 3.

FIG. 3 illustrates a chip 305 mounted in cavity 304. The chip has an active surface 305a, which includes the IC, a plurality 308 of central contact pads, and another plurality 307 of peripheral contact pads.

The second package part 310 has a top surface 310a, a bottom surface 310b, and an opening of width 350, sized to expose the central chip contact pads 308. The top surface 310a has I/O terminals 313, distributed around the opening 350. The bottom surface 310b has a first plurality 311 of I/O terminals aligned with the peripheral chip contact pads 307, and a second plurality 312 of I/O terminals aligned with the top surface I/O terminals 302 of the first package part 301.

As FIG. 3 shows, bonding wires 360 connect the central chip contact pads 308- to the top surface terminal pads 313. When ball bonding is employed, the balls of the bonds are preferably affixed to the pads 308 and the stitches to pads. 313. When ribbon bonding is employed, both pads 308 and pads 313 have wedge bonds.

Figure 4:
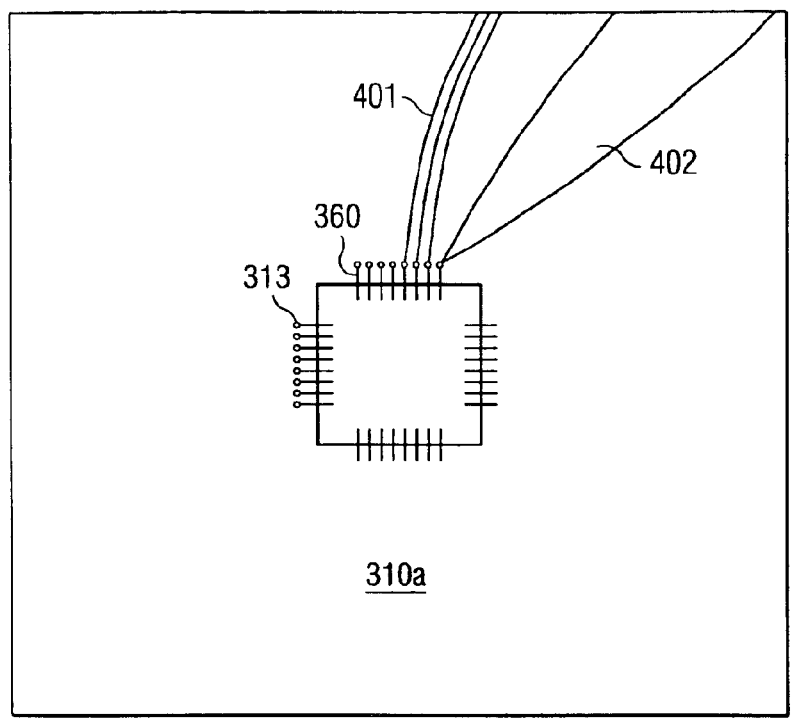
FIG. 4 is a schematic top view of the top surface of the second part of the package illustrated in FIG. 4 before the encapsulation of the device, depicting portions of the signal, power and ground traces, terminals and interconnecting bonding wires.

The second package part 310 also has connector lines, or "routing traces", between top surface terminals 313 and the first terminal plurality 311, and the second terminal plurality 312. In order to give an example of the layout of the signal and ground/power traces on the surface 310a of the second package part 310, FIG. 4 shows a simplified top view of the top surface 310a of the second package part 310. A very small portion of the signal traces 401 and the ground/power traces 402 are depicted, which are connected to the top surface terminals 313. Terminals 313, in turn, are connected by bonding wires 360 to the central chip contact pads.

The thickness of the top metal layer, forming signal and power/ground traces, is preferably between 25 and 75 $\mu$m, providing mechanical rigidity to the second package part 310. The insulator between the top and bottom conductor planes of the second package part also has a thickness in the range between 25 and 75 $\mu$m. The thickness of the bottom metal layer, forming signal and ground/power traces, is preferably between 10 and 50 $\mu$m.

Figure 5:
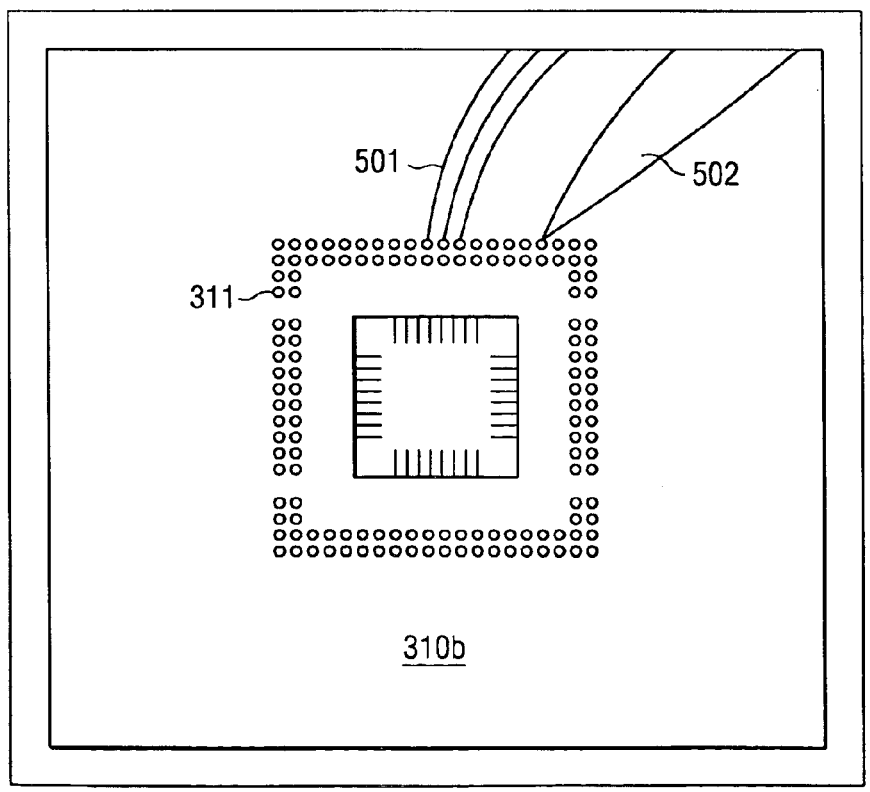
FIG. 5 is a schematic top view of the bottom surface of the second part of the package illustrated in FIG. 4, depicting portions of the signal, power and ground traces, and terminals for interconnection.

FIG. 5 shows a simplified top view of the bottom surface 310b of the second package part 310. A very small portion of the signal traces 501 and the ground/power traces 502 are depicted, which are connected to the first plurality 311 of I/O terminals of the second package part. 310. As illustrated in FIG. 3, terminals 311, in turn, are aligned with and connected to the peripheral chip contact pads 307.

Referring now to FIG. 3, package 300 has two types of interconnection elements between chip and package in addition to the wire bonding 360. In order to keep the size of the peripheral chip contact pads 307 as small as possible, the interconnection elements between pad 307 and the first plurality 311 of terminals of the second package part 310 are illustrated as stud bumps 320. Preferably, the chip contact pads 307, and thus the stud bumps 320, are spaced apart by less than 100 $\mu$m center to center. The stud bumps are preferably made of gold, copper, copper/nickel/palladium, or alloys thereof.

The other types of interconnection elements are between the second plurality 312 of bottom terminals of the second package part 310 and the top surface terminals 302 of the first package part 301. These interconnection elements 321 are preferably reflow interconnections such as solder "balls". Reflow balls or bumps typically use materials such as tin, tin alloys including tin/copper, tin/indium, tin/silver, tin/bismuth, tin/lead, indium, or conductive adhesives, or even z-axis conductives.

FIG. 3 illustrates the encapsulation of at least a portion of package 300 by protective material 370, preferably a molding compound. The encapsulation protects at least the bonding wires 360 and the related attachment places on the chip (terminals 308) and package (terminals 313). For package rigidity reasons, it is advantageous to also fill the remaining cavity 304 with encapsulation material.

The bottom surface terminals 303 of the first package part 301 serve to connect to external parts. In FIG. 3, interconnection elements 330, preferably made of reflow materials, are attached to terminals 303. Alternatively, terminals 303 can be connected by pressure contacts to external parts.

Figure 6:
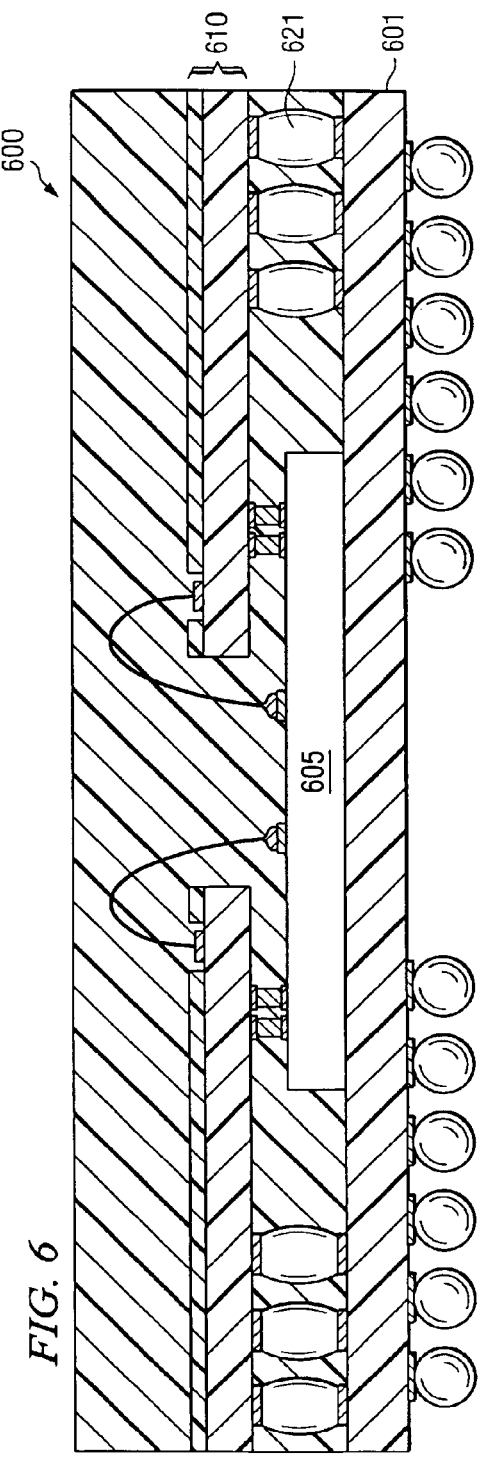
FIG. 6 is a schematic cross section of the package of an electronic device according to yet another embodiment of the invention.

Another embodiment of the invention, generally designated 600, is displayed in the schematic cross section of FIG. 6. It is related to the embodiment shown in FIG. 3 in an analogous way to the relation between the embodiment discussed in FIG. 2 and the embodiment of FIG. 1. The main difference between embodiment 600 and embodiment 300 is the flatness of the first package part 601, compared to the cavity 304 in first package part 301. Consequently, the package of FIG. 6 is especially suitable for thin IC chips 605, which are in the 25 to 100 μm thickness range. In addition, the reflow connections 621 between the first package part 601 and the second package part 610 are large compared to the reflow connections 321 in embodiment 300.

There are several methods to fabricate devices as displayed in FIGS. 3 and 6. Referring to FIG. 3, a preferred method of assembling an IC chip (305), having a passive surface (305b) and an active surface (305a) including central contact pads (308) and peripheral contact pads (307), into a cavity package, comprises the steps of:

depositing an interconnection element (320) on each of the peripheral chip contact pads (307), for instance by plating, electro-plating, sputtering, or evaporating; providing a first package part (301) having a cavity (304), I/O terminals on its top surface and its bottom surface (302 and 303, respectively);

mounting the passive chip surface (305b) into the cavity; depositing reflow interconnection material (321) on each of the top surface I/O terminals (302) of the first package part (301), for instance by plating, electro-plating, or attaching prefabricated units;

providing a second package part (310) having an opening (350) sized to expose the central chip contact pads (308), a top surface (310a) and a bottom surface (310b), the top surface having I/O terminals (313) distributed around opening (350), said bottom surface having a first plurality (311) of I/O terminals aligned with the peripheral chip contact pads (307), and a second plurality (312) of I/O terminals aligned with the top surface I/O terminals (302) of the first package part (301);

assembling the first plurality (311) of I/O terminals on the second package part's bottom surface with the interconnection elements (320) on the peripheral chip contact pads (307), for instance by thermo-compression gang bonding;

reflowing the interconnection material (321) of the top surface I/O terminals (302) of the first package part with the second plurality (312) of I/O terminals on the second package part's bottom surface; and wire bonding the central chip contact pads (308) to the top surface I/O terminals (313) of the second package part.

For many devices, it may be advantageous to add a process step of encapsulating the bonding wires (360) and portions of the second package part (310) and the chip (305), for example with a polymer compound. It is preferred to extend the encapsulation step to include an underfilling step to fill any spaces between the chip, the cavity, the second package part, and the interconnection elements with a non-conductive polymer.

It may be further advantageous for some devices to add the process step of attaching reflow interconnections to the I/O terminals (303) on the bottom surface of the first package part (301).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing. It is therefore intended that the appended claims encompass any such modifications or embodiments.

We claim:

1. A packaged integrated circuit (IC) device comprising:
   a first package part having a top surface and a bottom surface, said top and bottom surfaces having pads for I/O terminals, said first part having connector lines between terminals on said top surface and terminals on said bottom surface;
   a cavity in said first package part;
   a chip mounted in said cavity, said chip having an active surface including an IC and contact pads;
   a second package part having a top surface and a bottom surface, said bottom surface having a first plurality of I/O terminals aligned with said chip contact pads, and a second plurality of I/O terminals aligned with said top surface I/O terminals of said first package part;
   said second package part further having connector lines between said first and second plurality of terminals; said connector lines including a signal layer, a power layer, and a ground layer, spaced by insulation of a thickness between 10 and 50 μm, and formed into lines having a width less than three times said insulator thickness; and
   interconnection elements between said chip contact pads and said first plurality of terminals of said second package part, and between said second plurality of terminals of said second package part and said top surface terminals of said first package part.

2. The device according to claim 1 wherein said connector lines in said second package part comprise a signal/power layer and a ground layer, said layers spaced by insulation of a thickness between 10 and 50 μm, and formed into lines having a width less than three times said insulator thickness.

3. The device according to claim 1 wherein said chip contact pads are spaced apart by less than 100 μm, center to center.

4. The device according to claim 1 wherein said interconnection elements between said peripheral chip contact pads and said first plurality of terminals of said second package part are stud bumps.

5. The device according to claims 4 wherein said stud bumps are selected from a group consisting of gold, copper, copper/nickel/palladium, and alloys thereof.

6. The device according to claim 1 wherein said interconnection elements between said second plurality of terminals of said second part and said top surface terminals of said first part are reflow interconnections.

7. The device according to claim 6 wherein said reflow interconnections are made of a material selected from a group consisting of tin, tin alloys including tin/copper, tin/indium, tin/silver, tin/bismuth, tin/lead, indium, conductive adhesives, and z-axis conductives.

8. The device according to claim 1 further comprising interconnection elements attached to said bottom surface terminals of said first package part, operable to connect to external parts.

9. The device according to claim 1 wherein said chip has central contact pads as well as peripheral contact pads.

10. The device according to claim 9 wherein said second package part further comprises an opening sized to expose said central chip contact pads, and I/O terminals distributed around said opening, said terminals on said top surface.

11. The device according to claim 9 wherein said first plurality of bottom I/O terminals of the second package part is aligned with said peripheral chip contact pads.

12. The device according to claim 9 wherein bonding wires connect said central chip contact pads and said top surface terminals of said second package part.

13. The device according to claim 9 wherein interconnection elements connect said peripheral chip contact pads and said first plurality of terminals of said second package part, and said second plurality of terminals of said second package part and said top surface terminals of said first package part.

14. The device according to claim 12 further comprising encapsulation material covering said bonding wires and at least portion of said second package part and of said chip.

15. A packaged integrated circuit (IC) device comprising:
- a first package part having a top surface and a bottom surface, said top and bottom surfaces having pads for I/O terminals, said first part having connector lines between terminals on said top surface and terminals on said bottom surface;
- a chip mounted on said top surface of said first package part, said chip having an active surface including an IC and contact pads;
- a second package part having a top surface and a bottom surface, said bottom surface having a first plurality of I/O terminals aligned with said chip contact pads, and a second plurality of I/O terminals aligned with said top surface I/O terminals of said first package part;
- said second package part further having connector lines between said first and second plurality of terminals, including a signal layer, a power layer, and a ground layer, spaced by insulation of a thickness between 10 and 50 µm, and formed into lines having a width less than three times said insulator thickness; and
- interconnection elements between said chip contact pads and said first plurality of terminals of said second package part, and between said second plurality of terminals of said second package part and said top surface terminals of said first package part.

16. The device according to claim 15 wherein said connector lines in said second package part comprise a signal/power layer and a ground layer, said layers spaced by insulation of a thickness between 10 and 50 µm, and formed into lines having a width less than three times said insulator thickness.

17. The device according to claim, 15 wherein said chip contact pads are spaced apart by less than 100 µm, center to center.

18. The device according to claim 15 wherein said interconnection elements between said peripheral chip contact pads and said first plurality of terminals of said second package part are stud bumps.

19. The device according to claim 18 wherein said stud bumps are selected from a group consisting of gold, copper, copper/nickel/palladium, and alloys thereof.

20. The device according to claim 15 wherein said interconnection elements between said second plurality of terminals of said second part and said top surface terminals of said first part are reflow interconnections.

21. The device according to claim 20 wherein said reflow interconnections are made of a material selected from a group consisting of tin, tin alloys including tin/copper, tin/indium, tin/silver, tin/bismuth, tin/lead, indium, conductive adhesives, and z-axis conductives.

22. The device according to claim 15 further comprising interconnection elements attached to said bottom surface terminals of said first package part, operable to connect to external parts.

23. The device according to claim 15 wherein said chip has central contact pads as well as peripheral contact pads.

24. The device according to claim 23 wherein said second package part further comprises an opening sized to expose said central chip contact pads, and I/O terminals distributed around said opening, said terminals on said top surface.

25. The device according to claim 23 wherein said first plurality of bottom I/O terminals of the second package part is aligned with said peripheral chip contact pads.

26. The device according to claim 23 wherein bonding wires connect said central chip contact pads and said top surface terminals of said second package part.

27. The device according to claim 23 wherein interconnection elements connect said peripheral chip contact pads and said first plurality of terminals of said second package part, and said second plurality of terminals of said second package part and said top surface terminals of said first package part.

28. The device according to claim 23 further comprising encapsulation material covering said bonding wires and at least portion of said second package part and of said chip.

* * * * *